(12) United States Patent
Liang et al.

(10) Patent No.: US 12,055,832 B1
(45) Date of Patent: Aug. 6, 2024

(54) ARRAY SUBSTRATE COMPRISING A KEEL ELECTRODE CONFIGURED TO LOAD A COLORED-FILM-SUBSTRATE COMMON VOLTAGE AND DISPLAY PANEL

(71) Applicant: HKC CORPORATION LIMITED, Guangdong (CN)

(72) Inventors: Yujiao Liang, Guangdong (CN); Haijiang Yuan, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/340,127

(22) Filed: Jun. 23, 2023

(30) Foreign Application Priority Data

Mar. 8, 2023 (CN) .......................... 202310215928.0

(51) Int. Cl.
*G02F 1/1362* (2006.01)
*G02F 1/1368* (2006.01)
*H01L 27/12* (2006.01)

(52) U.S. Cl.
CPC .. *G02F 1/136286* (2013.01); *G02F 1/136218* (2021.01); *G02F 1/136222* (2021.01); *G02F 1/1368* (2013.01); *H01L 27/124* (2013.01)

(58) Field of Classification Search
CPC .............................................. G02F 1/136218
See application file for complete search history.

(56) References Cited

U.S. PATENT DOCUMENTS

| | | | | |
|---|---|---|---|---|
| 2004/0252266 | A1* | 12/2004 | Shimizu | G02F 1/133512 |
| | | | | 349/139 |
| 2012/0206683 | A1* | 8/2012 | Zhang | G02F 1/1343 |
| | | | | 349/139 |
| 2016/0195784 | A1 | 7/2016 | Kang et al. | |
| 2018/0196317 | A1* | 7/2018 | Hao | G02F 1/1368 |

FOREIGN PATENT DOCUMENTS

| | | | | |
|---|---|---|---|---|
| CN | 102062979 A | | 5/2011 | |
| CN | 105785683 A | | 7/2016 | |
| CN | 105867031 A | * | 8/2016 | ....... G02F 1/133514 |
| CN | 105867031 A | | 8/2016 | |
| CN | 106353939 A | * | 1/2017 | ....... G02F 1/133514 |
| CN | 110082970 A | | 8/2019 | |

OTHER PUBLICATIONS

First Office Action issued in corresponding CN Application No. 202310215928.0 dated Apr. 5, 2023.

* cited by examiner

*Primary Examiner* — Paul C Lee
(74) *Attorney, Agent, or Firm* — HAUPTMAN HAM, LLP

(57) ABSTRACT

An array substrate is provided. The array substrate includes a pixel electrode. The pixel electrode includes a pixel electrode periphery and a pixel electrode portion. The pixel electrode portion is disposed in and electrically connected to the pixel electrode periphery. In the pixel electrode portion, the first pixel electrode sub-portion, the second pixel electrode sub-portion, the third pixel electrode sub-portion, and the fourth pixel electrode sub-portion that are arranged (Continued)

four-squarely define a gap that is cross-shaped. A keel electrode configured to load a common voltage is at least partially received in the gap.

18 Claims, 10 Drawing Sheets

ARRAY SUBSTRATE COMPRISING A KEEL ELECTRODE CONFIGURED TO LOAD A COLORED-FILM-SUBSTRATE COMMON VOLTAGE AND DISPLAY PANEL

CROSS-REFERENCE TO RELATED APPLICATIONS

This application claims priority under 35 U.S.C. § 119(a) to Chinese Patent Application No. 202310215928.0, filed Mar. 8, 2023, the entire disclosure of which is incorporated herein by reference.

TECHNICAL FIELD

This disclosure relates to the field of display technology, and specifically, to an array substrate and a display panel.

BACKGROUND

With the development of photoelectric display technologies and semiconductor manufacturing technologies, Thin Film Transistor-Liquid Crystal Displays (TFT-LCDs) are increasingly mature, and have found increasingly wide utilization because of their advantages, for example, the TFT-LCDs are light and thin, and convenient to carry.

With the continuous development of display panels, requirements for visual effect displayed by the display panels are also increasing. Contrast Ratio (CR) is an important factor for visual effect displayed by a display panel. However, in the related art, when the display panel is in a dark state, since liquid crystals near keel electrodes are affected by electric fields of multiple directions, the liquid crystals at edges of the keel electrodes are arranged disorderly, and thus edge brightening occurs at the edges of the keel electrodes, thereby causing a relatively low CR. How to effectively improve the CR of the display panel becomes a technical problem to-be-solved.

SUMMARY

An array substrate and a display panel are provided in the disclosure.

In a first aspect, an array substrate is provided in the disclosure. The array substrate includes at least one pixel portion and at least one keel electrode. Each pixel portion includes at least one pixel electrode periphery and at least one pixel electrode portion. The pixel electrode portion is disposed in and electrically connected to the pixel electrode periphery. The pixel electrode portion includes a first pixel electrode sub-portion, a second pixel electrode sub-portion, a third pixel electrode sub-portion, and a fourth pixel electrode sub-portion that are arranged four-squarely. Each of the first pixel electrode sub-portion, the second pixel electrode sub-portion, the third pixel electrode sub-portion, and the fourth pixel electrode sub-portion includes multiple electrode lines arranged at intervals. Electrode lines of two adjacent pixel electrode sub-portions in the first pixel electrode sub-portion, the second pixel electrode sub-portion, the third pixel electrode sub-portion, and the fourth pixel electrode sub-portion extend in different directions. The first pixel electrode sub-portion, the second pixel electrode sub-portion, the third pixel electrode sub-portion, and the fourth pixel electrode sub-portion define a gap that is cross-shaped. The keel electrode is at least partially received in the gap, is spaced apart from the pixel portion, and is configured to load a colored-film-substrate common voltage.

In a second aspect, a display panel is provided in the disclosure. The display panel includes the array substrate and a colored-film module. A liquid crystal module is sandwiched between the array substrate and the colored-film module. The colored-film module includes a colored-film common electrode configured to load a colored-film-substrate common voltage.

BRIEF DESCRIPTION OF THE DRAWINGS

In order to describe technical solutions in implementations of the disclosure more clearly, the following will give a brief introduction to accompanying drawings required for describing implementations. Apparently, the accompanying drawings hereinafter described merely illustrate some implementations of the disclosure. Based on these drawings, those of ordinary skills in the art can also obtain other drawings without creative effort.

Figure 1:
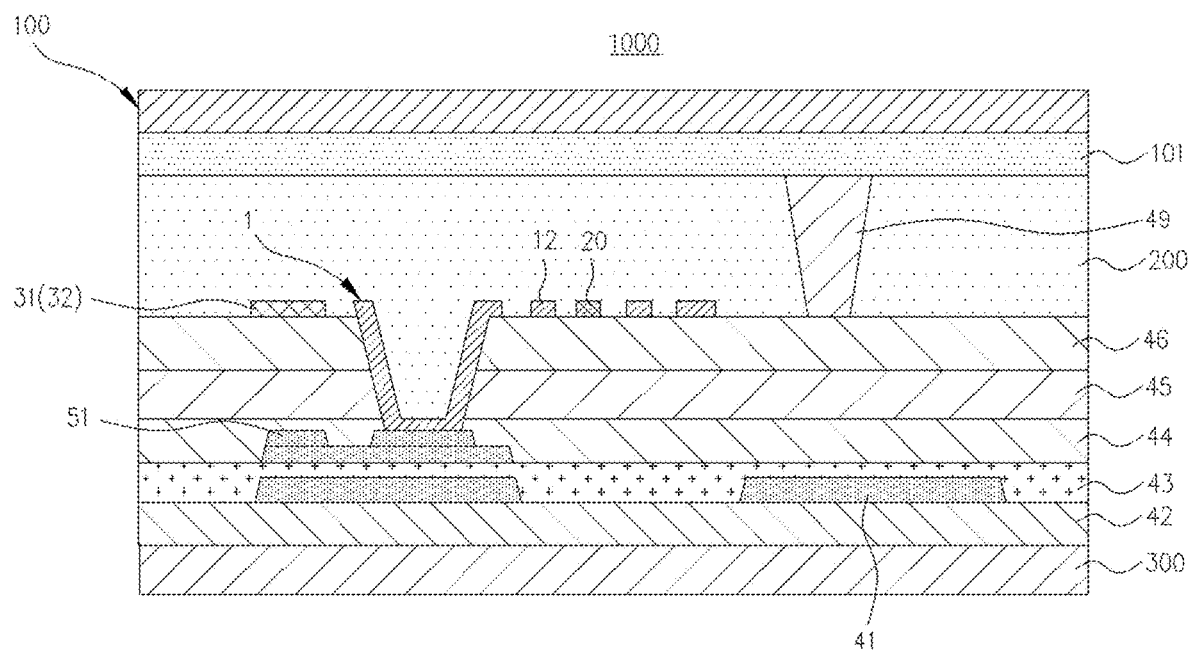
FIG. 1 is a schematic cross-sectional structural view of a type of display panel provided in an implementation of the disclosure.

ILLUSTRATION OF REFERENCE SIGNS display panel—1000, colored-film module—100, colored-film common electrode—110, liquid crystal module—200, backlight module—300, array substrate—1, pixel portion—10, primary pixel-portion—101, secondary pixel-portion—102, pixel electrode periphery—11, primary pixel-electrode-periphery—111, secondary pixel-electrode-periphery—112, pixel electrode portion—12, first pixel electrode sub-portion—121, second pixel electrode sub-portion—122, third pixel electrode sub-portion—123, fourth pixel electrode sub-portion—124, primary pixel-electrode-portion—125, secondary pixel-electrode-portion—126, gap—13, first cross-shaped gap—131, second cross-shaped gap—132, opening—14, first opening—141, second opening—142, electrode line—15, keel electrode—20, first keel electrode—21, second keel electrode—22, connection electrode—30, first shield electrode—31, second shield electrode—32, third shield electrode—33, array common electrode—41, TFT glass substrate—42, insulation layer—43, first planarization layer—44, light-filtering layer—45, second planarization layer—46, support member—49, black matrix layer—50, data line—51, first switch—61, second switch—62.

DETAILED DESCRIPTION

The following will illustrate clearly and completely technical solutions of implementations of the disclosure with reference to accompanying drawings of implementations of the disclosure. Apparently, implementations illustrated herein are merely some, rather than all implementations, of the disclosure. Based on the implementations of the disclosure, all other implementations obtained by those of ordinary skill in the art without creative effort shall fall within the protection scope of the disclosure.

The term "implementation" or "embodiment" referred to herein means that a particular feature, structure, or feature described in conjunction with the implementation or embodiment may be contained in at least one implementation of the disclosure. The phrase appearing in various places in the specification does not necessarily refer to the same implementation, nor does it refer to an independent or alternative implementation that is mutually exclusive with other implementations. It is explicitly and implicitly understood by those skilled in the art that an implementation described herein may be combined with other implementations.

It needs to be noted that the terms "first", "second", and the like used in the specification, the claims, and the accompany drawings of the disclosure are used to distinguish different objects rather than describe a particular order. The terms "include", "comprise", and "have" as well as variations thereof are intended to cover non-exclusive inclusion.

In the specification, for sake of convenience, words and phrases indicating orientations or position relationships, such as "center", "on", "under", "front", "back", "vertical", "horizontal", "top", "bottom", "in", "out", and the like are used to illustrate position relationships of elements according to accompanying drawings and are only for the convenience of illustration of the specification and simplicity of illustration, rather than explicitly or implicitly indicate that apparatuses or components referred to herein must have a certain orientation or be configured or operated in a certain orientation and therefore cannot be understood as limitations to the disclosure. The position relationships of elements can be appropriately changed according to directions of the illustrated elements. Therefore, the position relationships are not limited to the words and phrases in the specification and can be appropriately changed according to situations.

In the specification, unless specified and limited otherwise, terms "installing", "coupling", "connecting", and the like referred to herein should be understood in broader sense, for example, may indicate a fixed coupling (connection), a detachable coupling (connection), or an integrated coupling (connection), may be a mechanical coupling (connection), an electrical coupling (connection), and may be a direct coupling (connection), an indirect coupling (connection) through a medium, or an interconnection between two components. For those of ordinary skill in the art, the above terms in the disclosure can be understood according to situations.

With the development of photoelectric display technologies and semiconductor manufacturing technologies, Thin Film Transistor-Liquid Crystal Displays (TFT-LCDs) are increasingly mature, and have found increasingly wide utilization because of their advantages, for example, the TFT-LCDs are light and thin, and convenient to carry.

Contrast ratio (CR)=luminance L255 of a panel in a bright state/luminance LO of the panel in a dark state, where the luminance in the bright state refers to transmission as usual (in the case where a backlight brightness is constant, transmittance*backlight brightness=luminance in the bright state). Since transmission is affected by various factors and is difficult to improve, how to improve the CR is mainly how to reduce the luminance LO of an image, that is, how to reduce light leakage of an image in the dark state.

Figure 2:
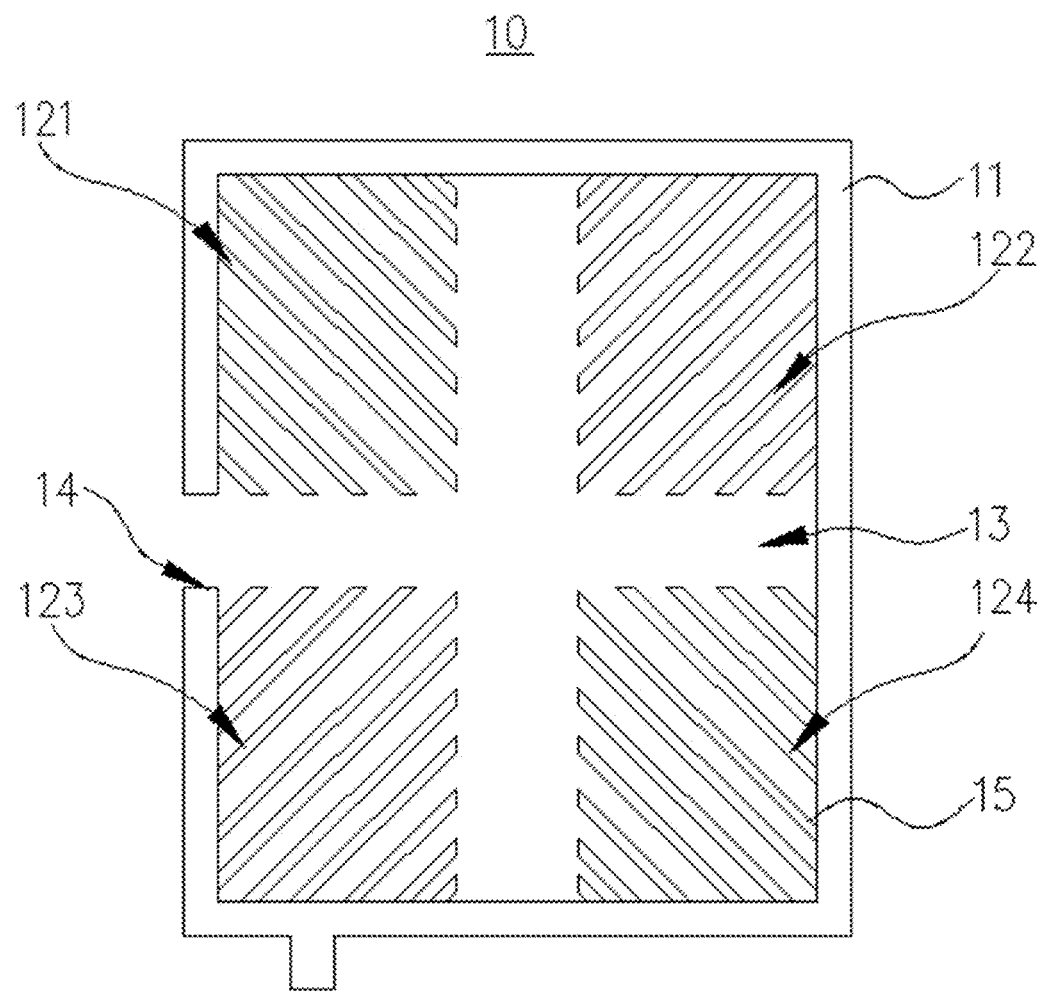
FIG. 2 is a schematic structural view of a type of pixel portion provided in an implementation of the disclosure.

Referring to FIGS. 1 and 2, FIG. 1 is a schematic cross-sectional structural view of a type of display panel provided in an implementation of the disclosure, and FIG. 2 is a schematic structural view of a type of pixel portion provided in an implementation of the disclosure. A display panel 1000 is provided in the disclosure to solve a technical problem of how to effectively improve a CR of the display panel 1000 in the related art.

An array substrate 1 is further provided in the disclosure. The display panel 1000 includes the array substrate 1. The array substrate 1 includes multiple data lines 51 and multiple scan lines (not illustrated in figures). An extending direction of each data line 51 intersects with an extending direction of each scan line, and the multiple data lines 51 intersect with the multiple scan lines to define multiple pixels. Each pixel includes at least one pixel portion 10. The pixel portion 10 includes at least one pixel electrode peripheral 11 and at least one pixel electrode portion 12. The pixel electrode portion 12 is disposed in and electrically connected to the pixel electrode periphery 11.

The pixel electrode portion 12 includes a first pixel electrode sub-portion 121, a second pixel electrode sub-portion 122, a third pixel electrode sub-portion 123, and a fourth pixel electrode sub-portion 124 that are arranged four-squarely. Each of the first pixel electrode sub-portion 121, the second pixel electrode sub-portion 122, the third pixel electrode sub-portion 123, and the fourth pixel electrode sub-portion 124 includes multiple electrode lines 15 arranged at intervals. Electrode lines 15 of the first pixel electrode sub-portion 121, the second pixel electrode sub-portion 122, the third pixel electrode sub-portion 123, and the fourth pixel electrode sub-portion 124 extend in different directions.

The first pixel electrode sub-portion 121, the second pixel electrode sub-portion 122, the third pixel electrode sub-portion 123, and the fourth pixel electrode sub-portion 124 define a gap 13 that is cross-shaped.

The display panel 1000 may further include a colored-film module 100, a liquid crystal module 200, and a backlight module 300 that are arranged in sequence, where the liquid crystal module 200 is sandwiched between the array substrate 1 and the colored-film module 100. The colored-film module 100 may include a colored-film common electrode 110 and a colored-film substrate. The colored-film common electrode 110 is disposed at a side of the colored-film substrate facing the pixel portion 10, and the colored-film common electrode 110 of the colored-film module 100 is configured to load a colored-film-substrate common voltage. The liquid crystal module 200 includes multiple liquid crystal molecules.

A voltage difference is formed between the pixel portion 10 and the colored-film common electrode 110 to control deflection of the liquid crystal molecules, so that lights emitted by the backlight module 300 can emit from the liquid crystal module 200 and the colored-film module 100.

Each of the first pixel electrode sub-portion 121, the second pixel electrode sub-portion 122, the third pixel electrode sub-portion 123, and the fourth pixel electrode sub-portion 124 includes the multiple electrode lines 15 arranged at intervals. Electrode lines 15 of the first pixel electrode sub-portion 121, the second pixel electrode sub-portion 122, the third pixel electrode sub-portion 123, and the fourth pixel electrode sub-portion 124 extend in different directions. Therefore, the liquid crystal molecules between the pixel electrode portion 12 and the colored-film common electrode 110 can be distributed in four regions, and the liquid crystal molecules in the four regions deflect differently, so that the lights emitted by the backlight module 300 can emit via the liquid crystal molecules with different deflection angles, thereby improving image display effect of the display panel 1000.

Generally, electrode lines of a pixel portion extend differently, so that liquid crystal molecules corresponding to the electrode lines that extend differently may be affected by electric fields of multiple directions. As a result, when the display panel is in the dark state, some liquid crystal molecules are arranged disorderly, and thus some lights emit, which may result in brightening at some positions of the display panel in the dark state, thereby causing a relatively low CR of the display panel.

In the array substrate 1 provided in the disclosure, the pixel electrode portion 12 of the pixel portion 10 includes the first pixel electrode sub-portion 121, the second pixel electrode sub-portion 122, the third pixel electrode sub-portion 123, and the fourth pixel electrode sub-portion 124 that are arranged four-squarely. The first pixel electrode sub-portion 121, the second pixel electrode sub-portion 122, the third pixel electrode sub-portion 123, and the fourth pixel electrode sub-portion 124 define the gap 13 that is cross-shaped. At a position corresponding to the gap 13, there is no voltage difference between the pixel portion 10 and the colored-film common electrode 110, and liquid crystal molecules at the position corresponding to the gap 13 may not be affected by the electric fields of the multiple directions and thus are arranged orderly. In this way, when the display panel 1000 is in the dark state, the liquid crystal molecules at the position corresponding to the gap 13 are arranged orderly, and brightening may not occur at the position corresponding to the gap 13 in the display panel 1000, thereby reducing the luminance of the display panel 1000 in the dark state and improving the display CR of the display panel 1000.

Figure 3:
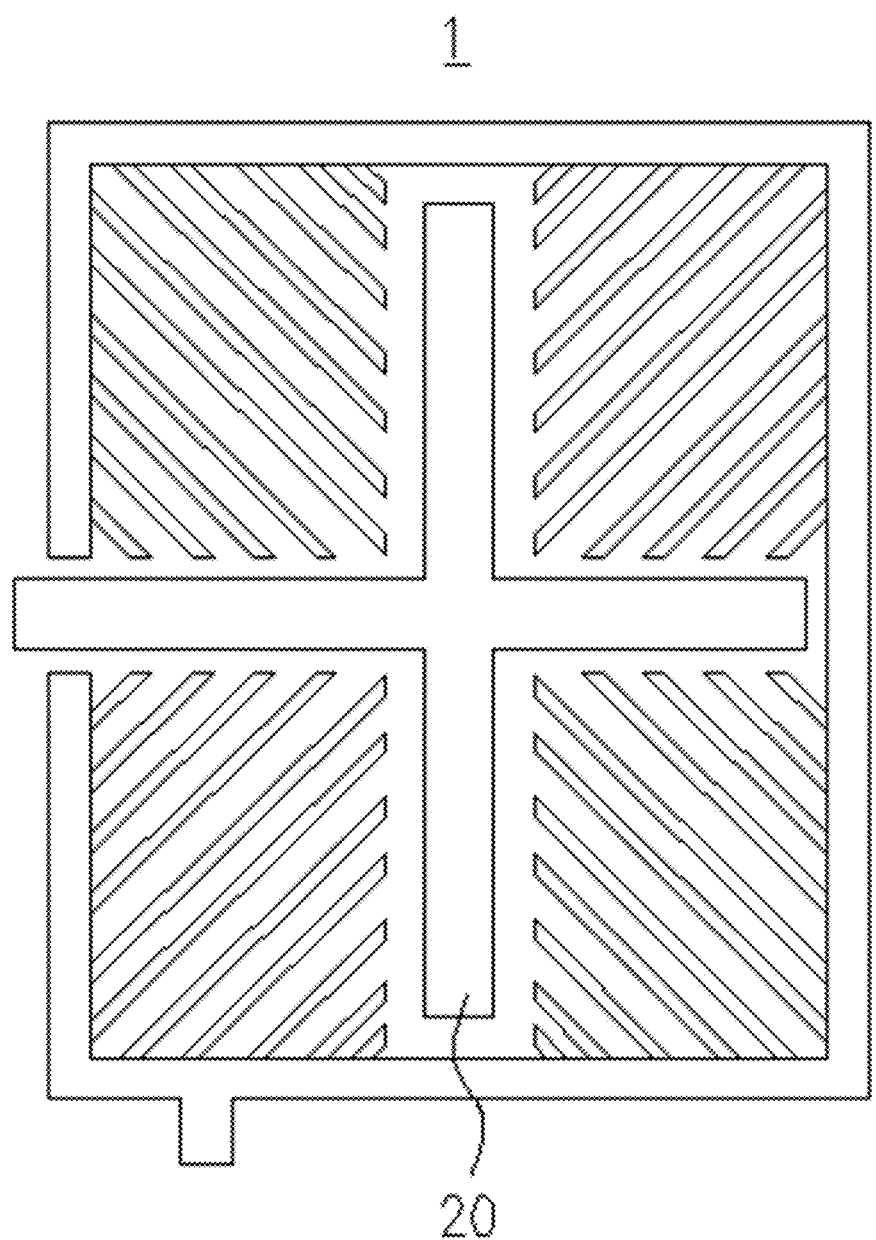
FIG. 3 is a schematic structural view 1 of a type of array substrate provided in an implementation of the disclosure.

Referring to FIG. 3 together, FIG. 3 is a schematic structural view 1 of a type of array substrate provided in an implementation of the disclosure. The array substrate 1 further includes at least one keel electrode 20. The keel electrode 20 is at least partially received in the gap 13, is spaced apart from the pixel portion 10, and is configured to load the colored-film-substrate common voltage.

The keel electrode 20 is configured to load the colored-film-substrate common voltage. In other words, a voltage of the keel electrode 20 is the same as a voltage of the colored-film common electrode 110. That is to say, a voltage difference between the keel electrode 20 and the colored-film common electrode 110 is 0.

The voltage of the keel electrode 20 is the same as the voltage of the colored-film common electrode 110. When the display panel 1000 is in the dark state, since the voltage difference between the keel electrode 20 and the colored-film common electrode 110 is 0, liquid crystal molecules between the keel electrode 20 and the colored-film common electrode 110 at a position corresponding to the keel electrode 20 may not be deflected. As such, no edge brightening may occur at the position corresponding to the keel electrode 20 in the display panel 1000, thereby reducing the luminance of the display panel 1000 in the dark state, and further improving the display CR of the display panel 1000 in the case where the luminance of the display panel 1000 in the bright state is unchanged or improved.

Figure 4:
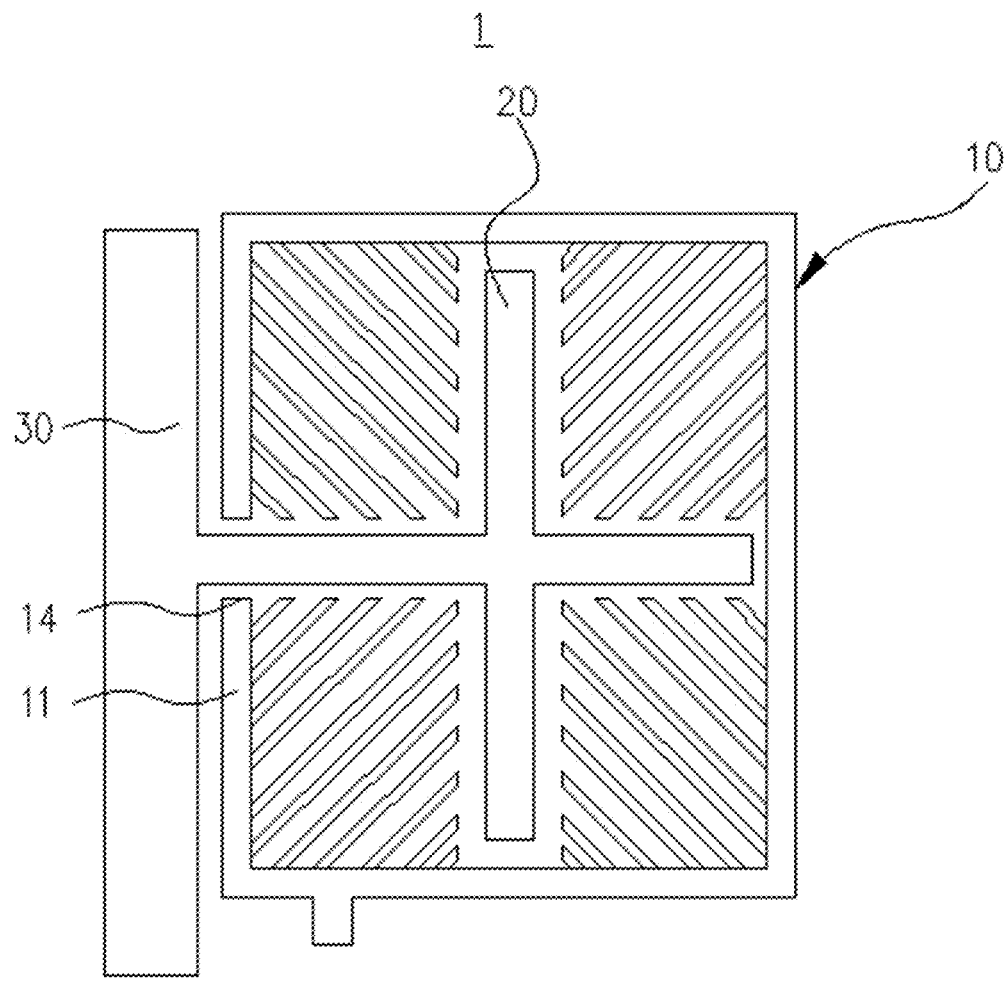
FIG. 4 is a schematic structural view 2 of a type of array substrate provided in an implementation of the disclosure.

Referring to FIG. 4 together, FIG. 4 is a schematic structural view 2 of a type of array substrate provided in an implementation of the disclosure. In an implementation, the array substrate 1 may further include at least one connection electrode 30. The connection electrode 30 is spaced apart from the pixel electrode periphery 11 of the pixel portion 10 and configured to load the colored-film-substrate common voltage. The pixel electrode periphery 11 defines an opening 14, and the keel electrode 20 extends out from the opening 14 and is electrically connected to the connection electrode 30.

The connection electrode 30 is spaced apart from the pixel electrode periphery 11 of the pixel portion 10 and configured to load the colored-film-substrate common voltage. The connection electrode 30 can be configured to shield signal interference between pixel portions 10 in two adjacent sub-pixels or shield signal interference between electrodes at upper and lower layers of the connection electrode 30.

The connection electrode 30 is electrically connected to the keel electrode 20 and configured to conduct the colored-film-substrate common voltage of the connection electrode 30 to the keel electrode 20, to enable that the voltage of the keel electrode 20 is the same as the voltage of the colored-film common electrode 110. The opening is defined on the keel electrode 20, which is convenient to inject the voltage of the connection electrode 30 into the keel electrode 20, so that the keel electrode 20 can be configured to load the colored-film-substrate common voltage which is the same as the voltage of the colored-film common electrode 110, and normal operation of the pixel portion 10 may not be affected. Furthermore, in this case, the connection electrode 30 and the keel electrode 20 each can function as a shield electrode.

Since the voltage difference between the keel electrode 20 and the colored-film common electrode 110 is 0, it is possible to avoid disordered arrangement of the liquid crystal molecules between the keel electrode 20 and the colored-film common electrode 110 at the position corresponding to the keel electrode 20.

Figure 5:
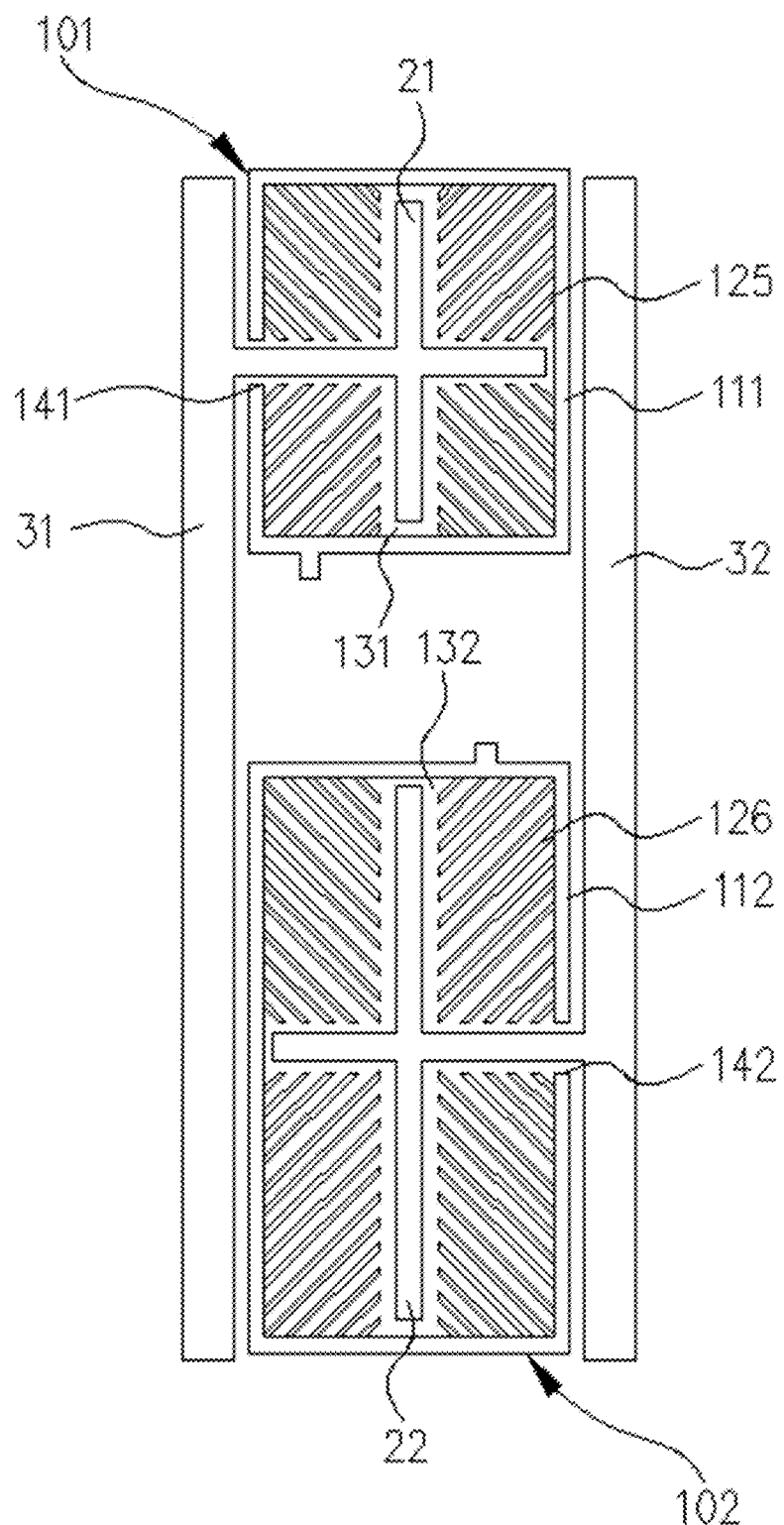
FIG. 5 is a schematic structural view 3 of a type of array substrate provided in an implementation of the disclosure.

Referring to FIG. 5 together, FIG. 5 is a schematic structural view 3 of a type of array substrate provided in an implementation of the disclosure. The pixel portion 10 may include a primary pixel-portion 101 and a secondary pixel-portion 102 spaced apart from the primary pixel-portion 101.

The primary pixel-portion 101 may include a primary pixel-electrode-periphery 111 and a primary pixel-electrode-portion 125. The primary pixel-electrode-periphery 111 defines a first opening 141. The primary pixel-electrode-portion 125 is disposed in and electrically connected to the primary pixel-electrode-periphery 111, and defines a first cross-shaped gap 131 therein.

The secondary pixel-portion 102 may include a secondary pixel-electrode-periphery 112 and a secondary pixel-electrode-portion 126. The secondary pixel-electrode-periphery 112 defines a second opening 142. The secondary pixel-electrode-portion 126 is disposed in and electrically connected to the secondary pixel-electrode-periphery 112, and defines a second cross-shaped gap 132.

The keel electrode 20 may include a first keel electrode 21 and a second keel electrode 22. The first keel electrode 21 is received in the first cross-shaped gap 131, extends out from the first opening 141, and is electrically connected to the connection electrode 30. The second keel electrode 22 is received in the second cross-shaped gap 132, extends out from the second opening 142, and is electrically connected to the connection electrode 30.

Optionally, in the implementation, the primary pixel-electrode-periphery 111 and the secondary pixel-electrode-periphery 112 are disposed in the same Red-Green-Blue (RGB) sub-pixel, and the primary pixel-electrode-portion 125 and the secondary pixel-electrode-portion 126 are disposed in the same RGB sub-pixel. In the implementation, the pixel is eight-domain designed, that is, one sub-pixel (pixel portion 10) includes the primary pixel-portion 101 and the secondary pixel-portion 102, the primary pixel-portion 101 has four domains, and the secondary pixel-portion 102 has four domains. Liquid crystal molecules corresponding to eight domains are controlled to deflect differently, thereby achieving a relatively wide viewing angle.

For example, the primary pixel-electrode-periphery 111 and the secondary pixel-electrode-periphery 112 are disposed in the same sub-pixel, and the primary pixel-electrode-periphery 111 and the secondary pixel-electrode-periphery 112 are disposed in the same RGB sub-pixel, which shall not be understood as a limit to the disclosure.

The primary pixel-electrode-portion 125 defines the first cross-shaped gap 131. The first keel electrode 21 is received in the first cross-shaped gap 131 and spaced apart from the primary pixel-electrode-portion 125. The secondary pixel-electrode-portion 126 defines the second cross-shaped gap 132. The second keel electrode 22 is received in the second cross-shaped gap 132 and spaced apart from the secondary pixel-electrode-portion 126. Each of the first keel electrode 21 and the second keel electrode 22 is electrically connected to the connection electrode 30 and configured to load the colored-film-substrate common voltage. Therefore, when the display panel 1000 is in the dark state, no edge brightening may occur at a position corresponding to the first keel electrode 21 and a position corresponding to the second keel electrode 22, thereby further improving the display CR of the display panel 1000.

In the implementation, the connection electrode 30 may include a first shield electrode 31 and a second shield electrode 32 disposed at two opposite sides of the pixel electrode periphery 11, respectively. Each of the first shield electrode 31 and the second shield electrode 32 extends in a direction in which the primary pixel-electrode-periphery 111 and the secondary pixel-electrode-periphery 112 are arranged. Each of the first shield electrode 31 and the second shield electrode 32 is configured to shield an electrical signal.

Specifically, the first opening 141 of the primary pixel-electrode-periphery 111 faces the first shield electrode 31, and the second opening 142 of the secondary pixel-electrode-periphery 112 faces the second shield electrode 32.

The first opening 141 faces the first shield electrode 31, and the first keel electrode 21 is electrically connected to the first shield electrode 31 through the first opening 141. When the display panel 1000 is in the dark state, no brightening occurs at a position in the display panel 1000 corresponding to the first keel electrode 21 in the first opening 141. The second opening 142 faces the second shield electrode 32, and the second keel electrode 22 is electrically connected to the second shield electrode 32 through the second opening 142. When the display panel 1000 is in the dark state, no brightening occurs at a position in the display panel 1000 corresponding to the second keel electrode 22 in the second opening 142. The first opening 141 and the second opening 142 are disposed at two sides of the pixel portion 10, respectively, so that the display panel 1000 has relatively good dark-state effect at positions corresponding to the two sides of the pixel portion 10, thereby further improving display uniformity of the display panel 1000 in the dark state.

Each of the first shield electrode 31 and the second shield electrode 32 is configured to shield an electrical signal. Specifically, the first shield electrode 31 and the second shield electrode 32 each can be configured to shield signals of pixel portions 10 in two adjacent RGB sub-pixels or shield signal interference between electrodes at upper and lower layers.

Furthermore, the display panel in the related art may further include data lines and scan lines, and a voltage difference generated between the data line and the colored-film common electrode and a voltage difference generated between the scan line and the colored-film common electrode may cause undesired deflection of liquid crystal molecules at a position corresponding to the data line and at a position corresponding to the scan line, thereby affecting the display effect of the display panel.

The array substrate 1 may further include an array common electrode 41. The array common electrode 41 is configured to load the colored-film-substrate common voltage. The connection electrode 30 is connected to the array common electrode 41 and configured to load the colored-film-substrate common voltage. Specifically, in the implementation, the connection electrode 30 is connected to the array common electrode 41 through a conductive via hole.

The connection electrode 30 is disposed between the data line 51 and the colored-film common electrode 110 and can be configured to shield a signal of the data line 51, thereby avoiding undesired deflection of liquid crystal molecules at a position corresponding to the data line 51 and improving the display effect of the display panel 1000. The connection electrode 30 is disposed between the scan line and the colored-film common electrode 110 and can be configured to shield a signal of the scan line, thereby avoiding undesired deflection of liquid crystal molecules at a position corresponding to the scan line and improving the display effect of the display panel 1000.

It needs to be noted that in the implementation, there are multiple data lines 51 arranged at intervals, and the first shield electrode 31 and the second shield electrode 32 are opposite to the data line 51 in a normal direction of the array substrate 1.

Figure 6:
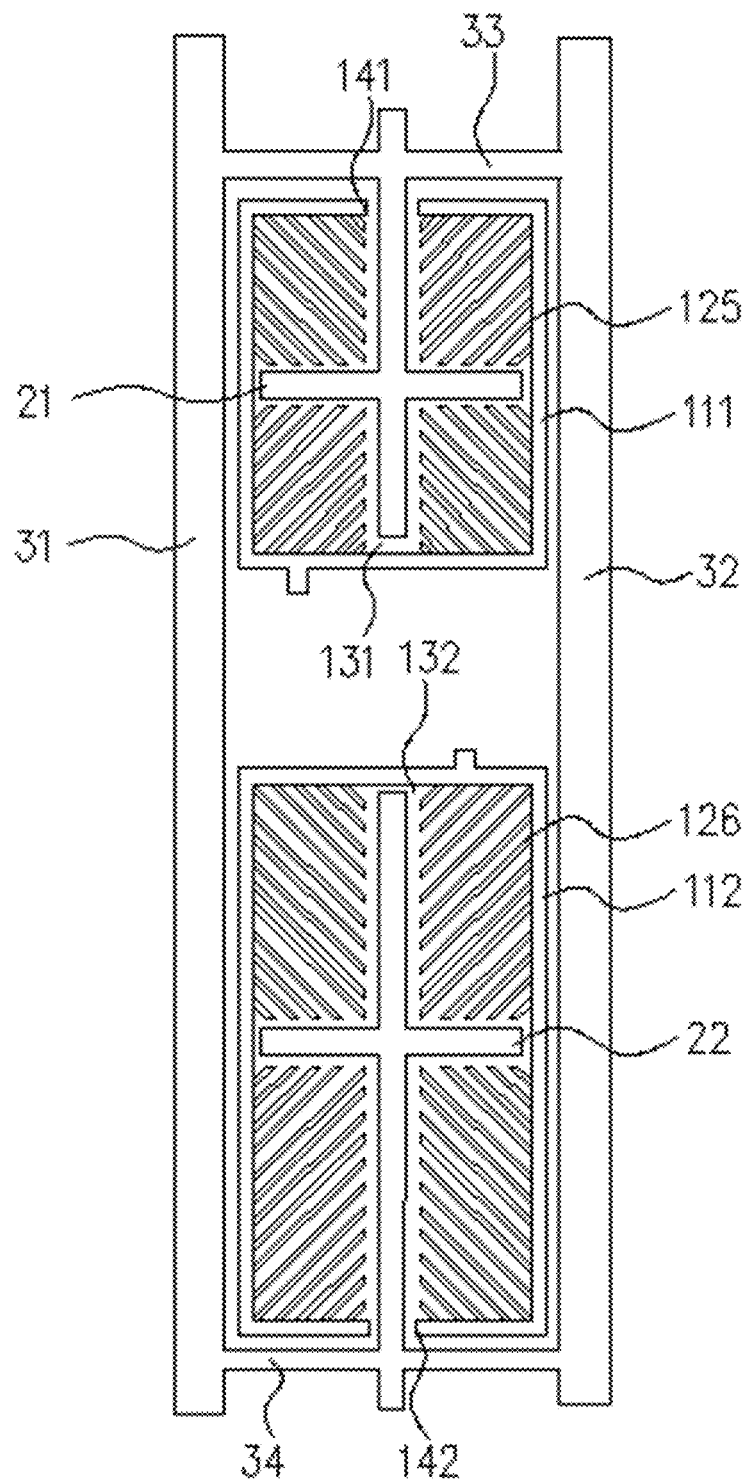
FIG. 6 is a schematic structural view 4 of a type of array substrate provided in an implementation of the disclosure.
Figure 7:
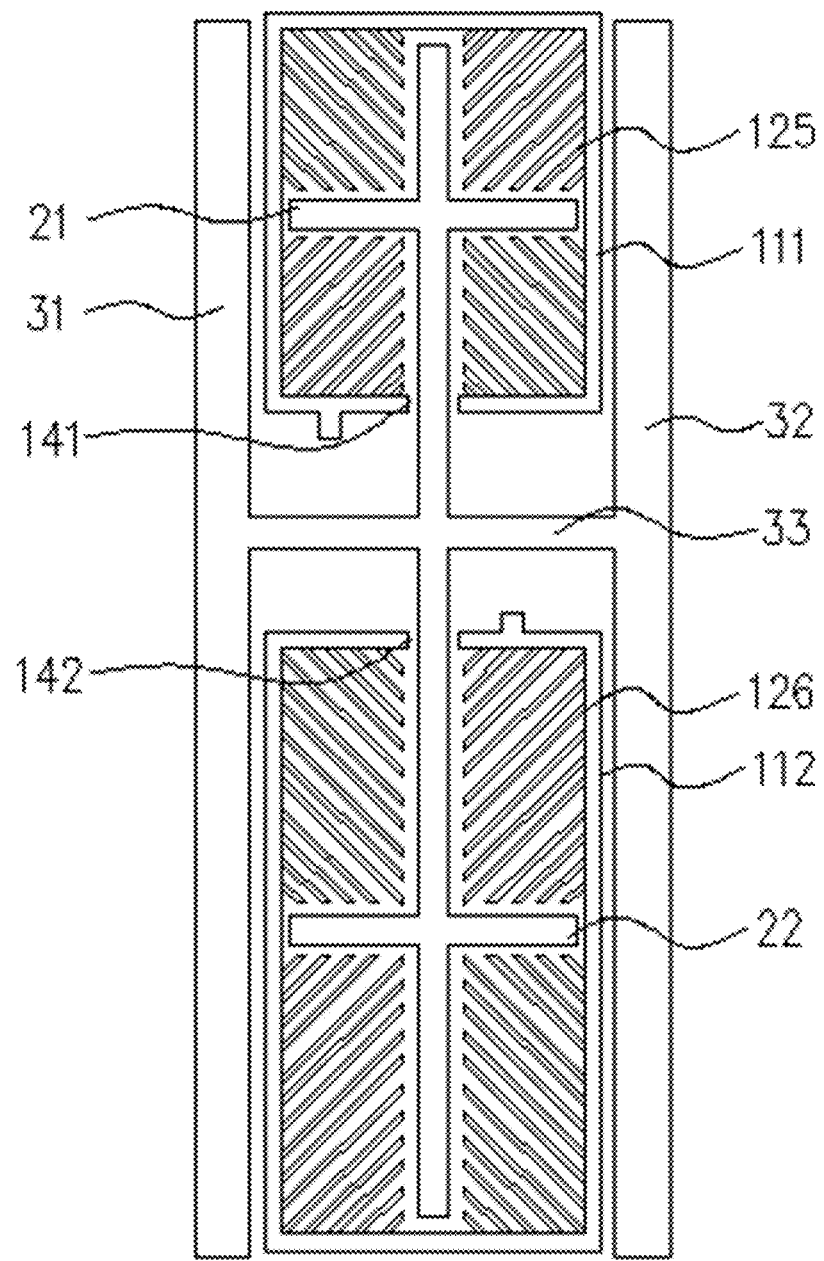
FIG. 7 is a schematic structural view 5 of a type of array substrate provided in an implementation of the disclosure.
Figure 8:
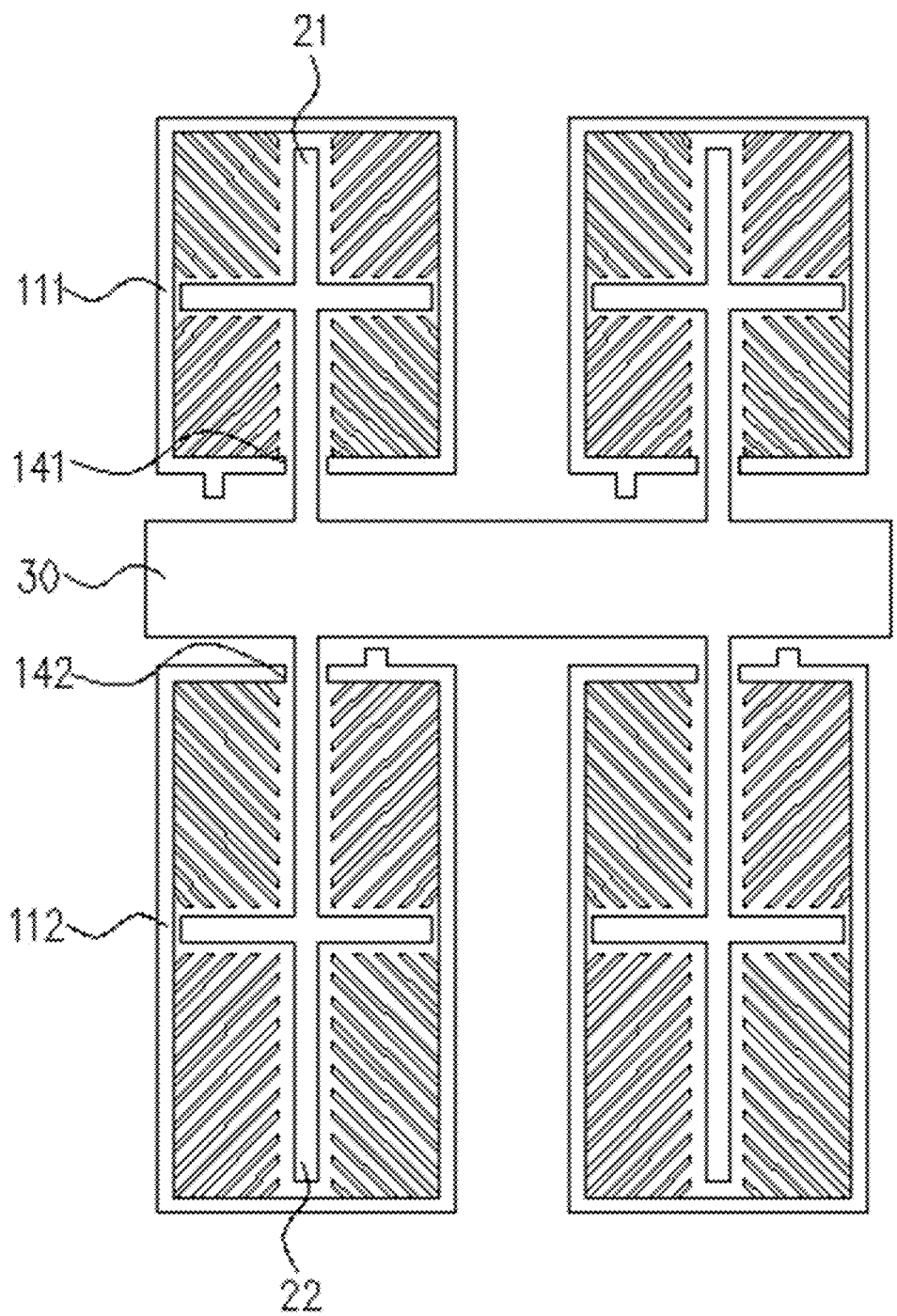
FIG. 8 is a schematic structural view 6 of a type of array substrate provided in an implementation of the disclosure.

Referring to FIGS. 6, 7, and 8, FIG. 6 is a schematic structural view 4 of a type of array substrate provided in an implementation of the disclosure, FIG. 7 is a schematic structural view 5 of a type of array substrate provided in an implementation of the disclosure, and FIG. 8 is a schematic structural view 6 of a type of array substrate provided in an implementation of the disclosure. The connection electrode 30 may further include a third shield electrode 33 opposite to the scan line in the normal direction of the array substrate 1. At least one of the first opening 141 or the second opening 142 faces the third shield electrode 33, and at least one of the first keel electrode 21 or the second keel electrode 22 is electrically connected to the third shield electrode 33.

The third shield electrode 33 is electrically connected between the first shield electrode 31 and the second shield electrode 32. A voltage of each of the first shield electrode 31 and the second shield electrode 32 is a common voltage, and a voltage of the third shield electrode 33 also is the common voltage. The third shield electrode 33 can be configured to load the common voltage to the first keel electrode 21 or the second keel electrode 22.

It needs to be noted that, in an implementation, there are multiple scan lines arranged at intervals, and the third shield electrode 33 is opposite to the scan line in the normal direction of the array substrate 1.

In other words, an orthographic projection of the third shield electrode 33 on the colored-film common electrode 110 covers an orthographic projection of the scan line on the colored-film common electrode 110. The third shield electrode 33 is disposed corresponding to the scan line of the array substrate 1 and configured to load the common voltage, so that the third shield electrode 33 can shield signal interference between electrodes at upper and lower layers. Likewise, the first shield electrode 31 and the second shield electrode 32 can be configured to shield signal interference between electrodes at upper and lower layers.

In the related art, in the case where there is a voltage difference between a metal electrode layer on the array substrate and a common electrode of the colored-film substrate, corresponding liquid crystal molecules are deflected, which may result in problems such as light leakage and bright lines of the display panel in the dark state. Therefore, a light-blocking structure, such as a black matrix layer, is required to be disposed on the array substrate or the colored-film substrate to avoid light emission, and thus avoiding bright lines of a display screen, or other problems.

In the implementation, referring to FIGS. 6 and 7, furthermore, the third shield electrode 33 is configured to load the colored-film-substrate common voltage. The third shield electrode 33 can be configured to shield signal interference between the scan line and the colored-film common electrode 110, so that liquid crystal molecules between the scan line opposite to the third shield electrode 33 and the colored-film common electrode 110 may not be deflected due to the voltage difference, thereby avoiding light leakage from a position corresponding to the scan line in the display panel 1000 in the dark state. Therefore, the array substrate 1 or the colored-film module 100 in the implementation can be provided with no lateral black matrix. The first shield electrode 31 and the second shield electrode 32 are configured to load the colored-film-substrate common voltage, and can be configured to shield signal interference between the data line 51 and the colored-film common electrode 110. As such, liquid crystal molecules between the scan line opposite to the first shield electrode 31 and the colored-film common electrode 110, and liquid crystal molecules between the scan line opposite to the second shield electrode 32 and the colored-film common electrode 110 are not deflected due to the voltage difference, thereby avoiding light leakage from a position corresponding to the data line 51 in the display panel 1000 in the dark state. Therefore, the array substrate 1 or the colored-film module 100 in the implementation can be provided with no longitudinal black matrix. Under the combined action of the first shield electrode 31, the second shield electrode 32, and the third shield electrode 33, the array substrate 1 or the colored-film module 100 in the implementation can be provided with no black matrix, thereby reducing manufacturing costs of the array substrate 1 or the colored-film module 100 and improving the display effect of the display panel 1000 in the dark state.

In another implementation, the connection electrode 30 may include the third shield electrode 33 opposite to the scan line in the normal direction of the array substrate 1. The first opening 141 of the primary pixel-electrode-periphery 111 faces the first shield electrode 31. The second opening 142 of the secondary pixel-electrode-periphery 112 faces the second shield electrode 32. The above implementations also belong to the scope of protection of the disclosure, which will not be described in detail herein.

Referring to FIG. 6, in the implementation, the connection electrode 30 may further include a fourth shield electrode 34 opposite to and spaced apart from the third shield electrode 33. The fourth shield electrode 34 is opposite to the scan line in the normal direction of the array substrate 1. The third shield electrode 33 is disposed at a side of the primary pixel-portion 101 away from the secondary pixel-portion 102. The first opening 141 faces the third shield electrode 33. The fourth shield electrode 34 is disposed at a side of the secondary pixel-portion 102 away from the primary pixel-portion 101. The second opening 142 faces the fourth shield electrode 34.

Specifically, in the implementation, the first opening 141 of the primary pixel-electrode-periphery 111 faces the third shield electrode 33, and the first keel electrode 21 is electrically connected to the third shield electrode 33 and configured to load the colored-film-substrate common voltage. The second opening 142 of the secondary pixel-electrode-periphery 112 faces the fourth shield electrode 34, and the second keel electrode 22 is electrically connected to the fourth shield electrode 34 and configured to load the colored-film-substrate common voltage.

The connection electrode 30 may further include the third shield electrode 33 and the fourth shield electrode 34. The third shield electrode 33 and the fourth shield electrode 34 both can be configured to shield signal interference between pixel units 10 in two adjacent sub-pixels, or shield signal interference between electrodes at upper and lower layers of the third shield electrode 33 and signal interference between electrodes at upper and lower layers of the fourth shield electrode 34.

Since there are no voltage difference between the third shield electrode 33 and the colored-film common electrode 110 and no voltage difference between the fourth shield electrode 34 and the colored-film common electrode 110, liquid crystal molecules between the third shield electrode 33 and the colored-film common electrode 110 and liquid crystal molecules between the fourth shield electrode 34 and the colored-film common electrode 110 are not deflected, so that when the display panel 1000 is in the dark state, no light leakage and no brightening occur at a position corresponding to the third shield electrode 33 and a position corresponding to the fourth shield electrode 34. Furthermore, the display panel 1000 has relatively good dark-state effect at positions corresponding to the two opposite ends of the pixel portion 10, thereby further improving the display uniformity of the display panel 1000 in the dark state.

Referring to FIG. 7, in another implementation, there is one third shield electrode 33, and the third shield electrode 33 is located between the primary pixel-portion 101 and the secondary pixel-portion 102. The first opening 141 and the second opening 142 both face the third shield electrode 33, and the first keel electrode 21 and the second keel electrode 22 both are electrically connected to the third shield electrode 33.

The third shield electrode 33 is located between the primary pixel-portion 101 and the secondary pixel-portion 102. Because there is no voltage difference between the third shield electrode 33 and the colored-film common electrode 110, liquid crystal molecules between the third shield electrode 33 and the colored-film common electrode 110 are not deflected, so that when the display panel 1000 is in the dark state, no light leakage and brightening occur at the position corresponding to the third shield electrode 33, and thus the display panel 1000 has relatively good dark-state effect at a position corresponding to the middle between the primary pixel-portion 101 and the secondary pixel-portion 102, thereby further improving the display uniformity of the display panel 1000 in the dark state.

Referring to FIG. 8, in another implementation, the connection electrode 30 is disposed between the primary pixel-electrode-periphery 111 and the secondary pixel-electrode-periphery 112. The connection electrode 30 extends in a direction perpendicular to the direction in which the primary pixel-electrode-periphery 111 and the secondary pixel-electrode-periphery 112 are arranged. The first opening 141 and the second opening 142 both face the connection electrode 30.

The first keel electrode 21 is electrically connected to one side of the connection electrode 30, and the second keel electrode 22 is electrically connected to the other side of the connection electrode 30. The extension direction of the connection electrode 30 is perpendicular to the direction in which the primary pixel-electrode-periphery 111 and the secondary pixel-electrode-periphery 112 are arranged, so that multiple keel electrodes 20 arranged in the extension direction of the connection electrode 30 each can be connected to the connection electrode 30, thereby improving a utilization rate of the connection electrode 30.

Figure 9:
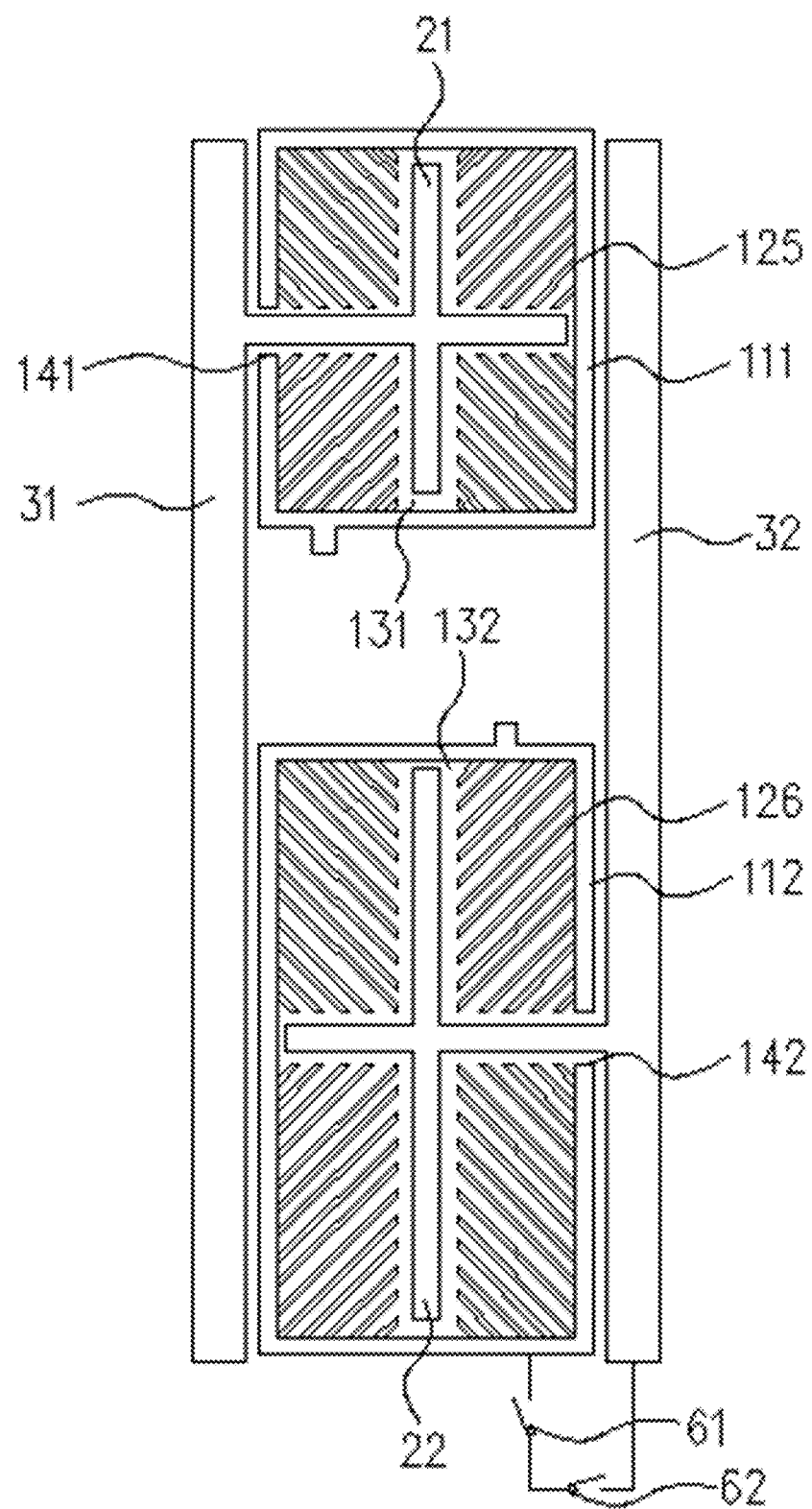
FIG. 9 is a schematic structural view 7 of a type of array substrate provided in an implementation of the disclosure.

Referring to FIG. 9, FIG. 9 is a schematic structural view 7 of a type of array substrate provided in an implementation of the disclosure. The array substrate 1 may further include a switch unit. The switch unit may include a first switch 61 and a second switch 62 electrically connected to the first switch 61. The first switch 61 is electrically connected to the secondary pixel-portion 102, and the secondary pixel-portion 102 is charged via the first switch 61. The second switch 62 is electrically connected to the connection electrode 30. The secondary pixel-portion 102 and the connection electrode 30 are in conduction connection via the first switch 61 and the second switch 62, and the secondary pixel-portion 102 discharges via the connection electrode 30. Each of the first switch 61 and the second switch 62 is a TFT, where the first switch 61 is an active switch of the secondary pixel-portion 102, and the second switch 62 is a secondary switch of the secondary pixel-portion 102. In the case where the first switch 61 is on, the pixel electrode is powered on, liquid crystal molecules are deflected, and a corresponding color is displayed. When the first switch 61 is off, the pixel electrode is powered off, liquid crystal molecules return to an initial state, and no color is displayed. The second switch 62 is connected to the connection electrode 30. When the second switch 62 is on, the pixel electrode undergoes partial leakage via the connection electrode 30, so that a voltage of the pixel electrode of the secondary pixel-portion 102 is less than a voltage of the pixel electrode of the primary pixel-portion 101, and thus a voltage of the primary pixel-portion 101 and a voltage of the secondary pixel-portion 102 are different, thereby widening a viewing angle of the display panel 1000.

In other words, in the implementation, the connection electrode 30 is used as a shared discharging rod, and the shared discharging rod is electrically connected to the secondary pixel-electrode-periphery 112. In other implementations, the shared discharging rod may also be electrically connected to the secondary pixel-electrode-portion 126, which is not limited in the disclosure.

In the case where the secondary pixel-portion 102 and the connection electrode 30 are in conduction connection via the switch unit, the shared discharging rod is configured to release partial voltage of the secondary pixel-electrode-periphery 112 or partial voltage of the secondary pixel-electrode-portion 126 to the shared discharging rod, thereby avoiding horizontal crosstalk in the pixel electrode.

The connection electrode 30 and the shared discharging rod are multiplexed in structure, thereby improving preparation efficiency of the array substrate 1, reducing the preparation costs of the array substrate 1, and facilitating mass production of the array substrate 1.

Figure 10:
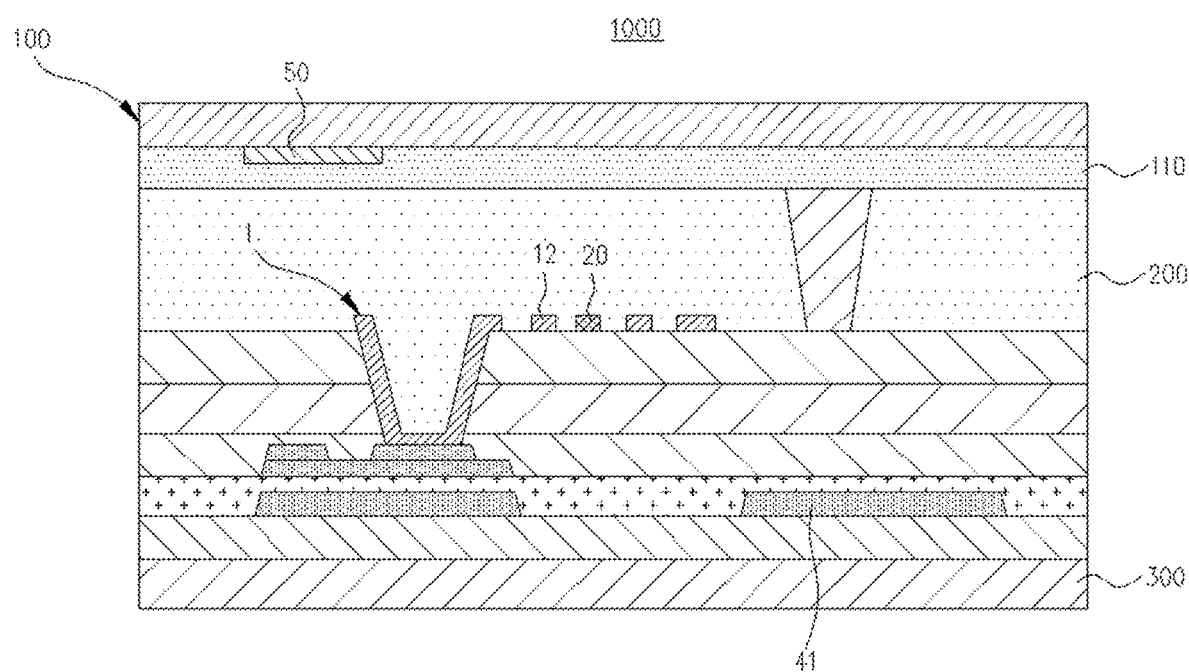
FIG. 10 is a schematic cross-sectional structural view of a type of display panel provided in an implementation of the disclosure.

In another implementation, referring to FIG. 10, FIG. 10 is a schematic cross-sectional structural view of a type of display panel provided in an implementation of the disclosure. Unlike the implementation illustrated in FIG. 1, in the implementation, the display panel 1000 is provided with no first shield electrode 31 and no second shield electrode 32 (in other words, the display panel 1000 is provided with no connection electrode 30). A lateral black matrix layer 50 and a longitudinal black matrix layer 50 are disposed between the colored-film common electrode 110 and the array common electrodes 41. The lateral black matrix layer 50 is opposite to the scan line of the array substrate 1, and the longitudinal black matrix layer 50 is opposite to the data line 51. The black matrix layer 50 can be configured to block light. Even if liquid crystal molecules at a position corresponding to the data line 51 and liquid crystal molecules at a position corresponding to the scan line are undesirably deflected, the black matrix layer 50 can also block such light, thereby improving the display effect of the display panel 1000.

In the implementation, since the lateral black matrix layer 50 and the longitudinal black matrix layer 50 are provided in the implementation, there is no need to provide a connection electrode 30, and the keel electrode 20 may also be electrically connected to the array common electrode 41 through the conductive via hole, so that the keel electrode 20 can be configured to load the colored-film-substrate common voltage.

In an implementation, the array common electrode 41 is electrically connected to the colored-film common electrode 110, and both the array common electrode 41 and the colored-film common electrode 110 can be configured to load the colored-film-substrate common voltage.

Referring to FIG. 1 again, the display panel 1000 may further include a TFT glass substrate 42, an insulation layer 43, a first planarization layer 44, a light-filtering layer 45, and a second planarization layer 46 that are arranged in sequence.

The display panel 1000 may include the array substrate 1, where a TFT, a pixel electrode layer, etc. are disposed on the array substrate 1. The second planarization layer 46 is disposed on the TFT. The display panel 1000 may further include a support member 49 disposed between the second planarization layer 46 and the colored-film module 100. The support member 49 is configured to support the colored-film module 100, so that a receiving space for receiving the liquid crystal molecules is defined between the colored-film module 100 and the second planarization layer 46.

The above implementations are only a part of implementations of the disclosure. It should be noted that, improvements and modifications may also be made by those skilled in the art without departing from the principle of the disclosure, and these improvements and modifications shall also belong to the scope of protection of the disclosure.

What is claimed is:

1. An array substrate, comprising a plurality of data lines and a plurality of scan lines, an extending direction of each of the plurality of data lines intersecting with an extending direction of each of the plurality of scan lines, the plurality of data lines intersecting with the plurality of scan lines to define a plurality of pixels, each of the plurality of pixels comprising at least one pixel portion and at least one keel electrode, and each pixel portion comprising:
   a pixel electrode periphery; and
   a pixel electrode portion disposed in and electrically connected to the pixel electrode periphery, wherein the pixel electrode portion comprises a first pixel electrode sub-portion, a second pixel electrode sub-portion, a third pixel electrode sub-portion, and a fourth pixel electrode sub-portion that are arranged four-squarely, each of the first pixel electrode sub-portion, the second pixel electrode sub-portion, the third pixel electrode sub-portion, and the fourth pixel electrode sub-portion comprises a plurality of electrode lines arranged at intervals, and electrode lines of two adjacent pixel electrode sub-portions in the first pixel electrode sub-portion, the second pixel electrode sub-portion, the third pixel electrode sub-portion, and the fourth pixel electrode sub-portion extend in different directions, wherein the first pixel electrode sub-portion, the second pixel electrode sub-portion, the third pixel electrode sub-portion, and the fourth pixel electrode sub-portion define a gap that is cross-shaped, wherein the keel electrode is at least partially received in the gap, is spaced apart from the pixel portion, and is configured to load a colored-film-substrate common voltage, and the array substrate further comprises at least one connection electrode, wherein the connection electrode is spaced apart from the pixel electrode periphery and configured to load the colored-film-substrate common voltage, the pixel electrode periphery defines an opening, and the keel electrode extends out from the opening and is electrically connected to the connection electrode.

2. The array substrate of claim 1, further comprising an array common electrode, wherein the array common electrode is configured to load the colored-film-substrate common voltage, the connection electrode is connected to the array common electrode, and the connection electrode is opposite to the data line and/or the scan line in a normal direction of the array substrate.

3. The array substrate of claim 1, wherein each pixel portion comprises a primary pixel-portion and a secondary pixel-portion spaced apart from the primary pixel-portion;

the primary pixel-portion comprises a primary pixel-electrode-periphery and a primary pixel-electrode-portion, wherein the primary pixel-electrode-periphery defines a first opening, and the primary pixel-electrode-portion is disposed in and electrically connected to the primary pixel-electrode-periphery, and defines a first cross-shaped gap;

the secondary pixel-portion comprises a secondary pixel-electrode-periphery and a secondary pixel-electrode-portion, wherein the secondary pixel-electrode-periphery defines a second opening, and the secondary pixel-electrode-portion is disposed in and electrically connected to the secondary pixel-electrode-periphery, and defines a second cross-shaped gap; and the keel electrode comprises a first keel electrode and a second keel electrode, wherein the first keel electrode is received in the first cross-shaped gap, extends out from the first opening, and is electrically connected to the connection electrode, and the second keel electrode is received in the second cross-shaped gap, extends out from the second opening, and is electrically connected to the connection electrode.

4. The array substrate of claim 3, further comprising a switch unit electrically connecting the secondary pixel-portion with the connection electrode, wherein when the secondary pixel-portion and the connection electrode are in conduction connection via the switch unit, the secondary pixel-portion discharges via the connection electrode.

5. The array substrate of claim 3, wherein the connection electrode comprises a first shield electrode and a second shield electrode disposed at two opposite sides of the pixel portion, respectively, wherein each of the first shield electrode and the second shield electrode extends in a direction in which the primary pixel-portion and the secondary pixel-portion are arranged, and each of the first shield electrode and the second shield electrode is configured to shield an electrical signal; the first opening faces the first shield electrode, and the second opening faces the second shield electrode; and the plurality of data lines are arranged at intervals, and the first shield electrode and the second shield electrode are opposite to the data line in the normal direction of the array substrate.

6. The array substrate of claim 3, wherein the connection electrode further comprises a third shield electrode opposite to the scan line in the normal direction of the array substrate, at least one of the first opening or the second opening faces the third shield electrode, and at least one of the first keel electrode or the second keel electrode is electrically connected to the third shield electrode.

7. The array substrate of claim 6, wherein the third shield electrode is located between the primary pixel-portion and the secondary pixel-portion, and the first opening and the second opening both faces the third shield electrode.

8. The array substrate of claim 6, wherein the connection electrode further comprises a fourth shield electrode opposite to and spaced apart from the third shield electrode, wherein the fourth shield electrode is opposite to the scan line in the normal direction of the array substrate, the third shield electrode is disposed at a side of the primary pixel-portion away from the secondary pixel-portion, the first opening faces the third shield electrode, and the first keel electrode is electrically connected to the third shield electrode, the fourth shield electrode is disposed at a side of the secondary pixel-portion away from the primary pixel-portion, the second opening faces the fourth shield electrode, and the second keel electrode is electrically connected to the fourth shield electrode.

9. A display panel, comprising:

an array substrate;

a colored-film module comprising a colored-film common electrode configured to load a colored-film-substrate common voltage; and a liquid crystal module sandwiched between the array substrate and the colored-film module, wherein the array substrate comprises a plurality of data lines and a plurality of scan lines, an extending direction of each of the plurality of data lines intersects with an extending direction of each of the plurality of scan lines, the plurality of data lines intersect with the plurality of scan lines to define a plurality of pixels, each of the plurality of pixels comprises at least one pixel portion and at least one keel electrode, and each pixel portion comprises:

a pixel electrode periphery; and a pixel electrode portion disposed in and electrically connected to the pixel electrode periphery, wherein the pixel electrode portion comprises a first pixel electrode sub-portion, a second pixel electrode sub-portion, a third pixel electrode sub-portion, and a fourth pixel electrode sub-portion that are arranged four-squarely, each of the first pixel electrode sub-portion, the second pixel electrode sub-portion, the third pixel electrode sub-portion, and the fourth pixel electrode sub-portion comprises a plurality of electrode lines arranged at intervals, and electrode lines of two adjacent pixel electrode sub-portions in the first pixel electrode sub-portion, the second pixel electrode sub-portion, the third pixel electrode sub-portion, and the fourth pixel electrode sub-portion extend in different directions, wherein the first pixel electrode sub-portion, the second pixel electrode sub-portion, the third pixel electrode sub-portion, and the fourth pixel electrode sub-portion define a gap that is cross-shaped, wherein the keel electrode is at least partially received in the gap, is spaced apart from the pixel portion, and is configured to load the colored-film-substrate common voltage, and the array substrate further comprises at least one connection electrode, wherein the connection electrode is spaced apart from the pixel electrode periphery and configured to load the colored-film-substrate common voltage, the pixel electrode periphery defines an opening, and the keel electrode extends out from the opening and is electrically connected to the connection electrode.

10. The display panel of claim 9, wherein the array substrate further comprises an array common electrode, wherein the array common electrode is configured to load the colored-film-substrate common voltage, the connection electrode is connected to the array common electrode, and the connection electrode is opposite to the data line and/or the scan line in a normal direction of the array substrate.

11. The display panel of claim 9, wherein each pixel portion comprises a primary pixel-portion and a secondary pixel-portion spaced apart from the primary pixel-portion;

the primary pixel-portion comprises a primary pixel-electrode-periphery and a primary pixel-electrode-portion, wherein the primary pixel-electrode-periphery defines a first opening, and the primary pixel-electrode-portion is disposed in and electrically connected to the primary pixel-electrode-periphery, and defines a first cross-shaped gap;

the secondary pixel-portion comprises a secondary pixel-electrode-periphery and a secondary pixel-electrode-portion, wherein the secondary pixel-electrode-periphery defines a second opening, and the secondary pixel-electrode-portion is disposed in and electrically connected to the secondary pixel-electrode-periphery, and defines a second cross-shaped gap; and the keel electrode comprises a first keel electrode and a second keel electrode, wherein the first keel electrode is received in the first cross-shaped gap, extends out from the first opening, and is electrically connected to the connection electrode, and the second keel electrode is received in the second cross-shaped gap, extends out from the second opening, and is electrically connected to the connection electrode.

12. The display panel of claim 11, wherein the array substrate further comprises a switch unit electrically connecting the secondary pixel-portion with the connection electrode, wherein when the secondary pixel-portion and the connection electrode are in conduction connection via the switch unit, the secondary pixel-portion discharges via the connection electrode.

13. The display panel of claim 11, wherein the connection electrode comprises a first shield electrode and a second shield electrode disposed at two opposite sides of the pixel portion, respectively, wherein each of the first shield electrode and the second shield electrode extends in a direction in which the primary pixel-portion and the secondary pixel-portion are arranged, and each of the first shield electrode and the second shield electrode is configured to shield an electrical signal; the first opening faces the first shield electrode, and the second opening faces the second shield electrode; and the plurality of data lines are arranged at intervals, and the first shield electrode and the second shield electrode are opposite to the data line in the normal direction of the array substrate.

14. The display panel of claim 11, wherein the connection electrode further comprises a third shield electrode opposite to the scan line in the normal direction of the array substrate, at least one of the first opening or the second opening faces the third shield electrode, and at least one of the first keel electrode or the second keel electrode is electrically connected to the third shield electrode.

15. The display panel of claim 14, wherein the third shield electrode is located between the primary pixel-portion and the secondary pixel-portion, and the first opening and the second opening both faces the third shield electrode.

16. The display panel of claim 14, wherein the connection electrode further comprises a fourth shield electrode opposite to and spaced apart from the third shield electrode, wherein the fourth shield electrode is opposite to the scan line in the normal direction of the array substrate, the third shield electrode is disposed at a side of the primary pixel-portion away from the secondary pixel-portion, the first opening faces the third shield electrode, and the first keel electrode is electrically connected to the third shield electrode, the fourth shield electrode is disposed at a side of the secondary pixel-portion away from the primary pixel-portion, the second opening faces the fourth shield electrode, and the second keel electrode is electrically connected to the fourth shield electrode.

17. The display panel of claim 9, wherein the array substrate further comprises an array common electrode, and the display panel further comprises a lateral black matrix layer and a longitudinal black matrix layer disposed between the colored-film common electrode and the array common electrode, wherein the lateral black matrix layer is opposite to the scan line of the array substrate, and the longitudinal black matrix layer is opposite to the data line of the array substrate.

18. The display panel of claim 9, further comprising a planarization layer and a support member, wherein the support member is disposed between the planarization layer and the colored-film module and configured to support the colored-film module to define a receiving space between the colored-film module and the planarization layer, wherein the receiving space is configured to receive liquid crystal molecules of the liquid crystal module.

* * * * *